(12) United States Patent
Bethke

(10) Patent No.: US 7,538,328 B1
(45) Date of Patent: May 26, 2009

(54) IMAGING DETECTOR

(75) Inventor: Klaus Bethke, Almelo (NL)

(73) Assignee: PANalytical B.V., Almelo (NL)

( * ) Notice: Subject to any disclaimer, the term of this patent is extended or adjusted under 35 U.S.C. 154(b) by 0 days.

(21) Appl. No.: 12/041,148

(22) Filed: Mar. 3, 2008

(30) Foreign Application Priority Data

Feb. 5, 2008 (GB) ................. 0802088.5

(51) Int. Cl.
*G01T 1/24* (2006.01)
(52) U.S. Cl. .................. 250/370.09
(58) Field of Classification Search ........... 250/370.09; 257/183
See application file for complete search history.

(56) References Cited

U.S. PATENT DOCUMENTS

| 5,889,313 | A | 3/1999 | Parker |
| 6,204,087 | B1 | 3/2001 | Parker et al. |
| 6,838,673 | B2* | 1/2005 | Morishita ............. 250/370.09 |
| 6,933,503 | B2 | 8/2005 | Sipilä et al. |
| 2006/0086950 | A1* | 4/2006 | Caymax et al. ............. 257/183 |

FOREIGN PATENT DOCUMENTS

JP  2002299654 A  * 10/2002

\* cited by examiner

*Primary Examiner*—Constantine Hannaher
(74) *Attorney, Agent, or Firm*—Bromberg & Sunstein LLP

(57) ABSTRACT

A sensor for detecting ionizing radiation such as X-rays or electrons in an imaging detector, with a germanium substrate 12 and top and bottom silicon layers 14,16. The silicon layers may be passivated. The bulk of absorption takes place in the germanium. Anode and cathode electrodes 44, 46 may be provided alternately to laterally bias the substrate. Alternatively, the silicon layers may be doped to vertically bias the substrate.

5 Claims, 2 Drawing Sheets

IMAGING DETECTOR

CROSS REFERENCE TO RELATED APPLICATIONS

This application claims priority from United Kingdom Patent Application Serial No. GB 0802088.5, filed on Feb. 5, 2008, which is hereby incorporated by reference, in its entirety.

FIELD OF INVENTION

The invention relates to a radiation detector, and in particular embodiments to a radiation detector of a hybrid type including an integrated circuit for carrying out counting of X-rays, electrons or generally ionizing radiation.

BACKGROUND ART

Imaging radiation detectors, for example for X-rays, electrons or generally ionizing radiation, can take the form of a hybrid, in which a read-out chip includes electronics for reading out and processing data, and a sensor is mounted directly over the read-out chip, this assembly having a number of pixels resulting from a regular grid of interconnection bonds between the sensor and the read-out chip (planar geometry).

In an alternative setup the sensor itself has pixels due to a regular arrangement of electrodes machined into the sensor (3D geometry). The pixels are to detect X-rays or electrons or generally ionized radiation, spatially resolved, arriving at the respective pixel. When an X-ray, electron or generally ionizing radiation interacts with a pixel, it creates electric charge which is read out by the read-out chip. Such detectors can act as imaging sensors. See for examples of this approach U.S. Pat. No. 5,889,313 and U.S. Pat. No. 6,204,087.

A commercial radiation detector of the first type is the PIXcel (trade mark) detector sold by Panalytical BV which uses a Si sensor. Each pixel of the sensor has a respective bump bond connecting the pixel to a respective read-out circuit.

When an X-ray is absorbed in a pixel of the sensor it interacts with an atom to produce a photoelectron that in turn excites a number of outer electrons from neighbouring atoms and hence creates a cloud of electrons (or holes) in a small spatial region of the sensor material. There may be of order a couple of thousand electrons in the cloud. The number of electrons is proportional to the energy of the X-ray photon. The bias voltage causes the cloud to diffuse to the back of the sensor where it is passed through the bump bond to the read-out chip and is transformed into an electrical pulse by the individual circuit of the pixel and detected as a count.

The read-out chip can process the electrical pulse created to build up an image. This can be done in a number of ways. Usually counts are collected and spatially resolved, in the pixel matrix of the detector once a generated electrical pulse exceeds a voltage threshold. The different amounts of counts collected in the pixel matrix form an absorption contrast pattern, i.e., an image of an object. In X-ray diffraction experiments the counts of pixels form 2-dimensional X-ray diffraction patterns and they can also be specially integrated or binned together to form diffractograms the latter being realized with the PIXcel detector.

Another option for pixel detectors is for example, that by detecting the size of the pulse in an energy window, and hence the number of electrons generated in the cloud, the energy of the photon can be determined so the approach can in principle be used for energy-dispersive X-ray imaging.

Germanium is used as a radiation detector for high-energy (nuclear) applications, typically using very thick germanium sensors.

The use of germanium instead of Si in a hybrid radiation detector for lower energy radiation, for example 5 to 20 keV, is however made much more difficult because of the absence of good processes for processing germanium. In particular, both contacts to germanium and bump bond contacts are required. The applicants are not aware of any suitable conventional ohmic contact processes in the public domain, though ohmic contacts to germanium are available from some providers who provide this service using proprietary processes. There does not appear to be any known process at all for reliably bump or flip-chip bonding to germanium.

One approach to the use of germanium in a radiation detector is taught by U.S. Pat. No. 6,933,503 which describe a bulk germanium X-ray detector sandwiched between two thin oppositely doped GaAs layers which accordingly constitute a pn diode. One of the GaAs layers is divided to make a plurality of pixels. The germanium is much thicker than the GaAs layers so that the X-rays are absorbed in the bulk germanium.

The patent suggests that the materials system is suitable for a number of reasons, including the similarity of lattice constants between Ge and GaAs, as well as the minimal recombination at the interface.

However, the Ge/GaAs materials system proposed by this patent is very difficult to implement for building hybrid pixel detectors in practice.

Although the field of GaAs pixel assemblies including bump-bonding has been researched for more than a decade, the material is still very crucial and problematic for general performance. This is not only an issue of the bulk material itself but an important aspect is, despite all efforts, still the bump-bonding process. The cited patent proposes an alternative patterned structure in the thin GaAs sandwich layer to form pixels which, however, is very special and far removed from existing main-stream bonding processes. This makes the proposed radiation detector difficult to manufacture.

There thus remains a need for a practical Ge based imaging radiation detector.

SUMMARY OF INVENTION

According to an aspect of the invention there is provided an imaging detector having a radiation sensor of Ge having upper and lower silicon layers on its surfaces.

Previously, attempts to use Ge as a detector have focussed on ways of overcoming the difficult problem of contacting to the Ge. Indeed, this is an active research area in which steady progress is being made.

However, it has now been realised that by providing layers of silicon on the upper and lower sides of the sensor conventional silicon processing can be used to manufacture the radiation detector rather than using the much more difficult, if not impossible, processing on germanium. This allows the use of a thinner detector for the same absorption, and may in particular allow improved absorption at energies above 10 keV.

The use of Ge makes it much easier to manufacture an imaging detector than using any prior approach, using either of two approaches.

In one approach, the layers of silicon are both complete, unpatterned layers, which may have a thickness 1 µm to 5 µm.

By avoiding any need to pattern the sensor, apart from to provide an array of contacts, processing is greatly simplified.

In the other approach, cathode and anodes extend perpendicularly through the substrate and are both connected to a read-out chip through contacts on the lower surface of the sensor.

Note that the approach according to this arrangement solves a problem that exists with current X-ray detectors under research using anode rods such as that described in U.S. Pat. No. 5,889,313 and U.S. Pat. No. 6,204,087.

Implementations of these detectors use a relatively thin substrate, typically a 200 μm Si substrate, since it is difficult to form suitable holes through thicker substrates without the pixel size becoming too large and the rods too broad. Alternatively, a thicker substrate may be used with a rod structure in which the rods only extend partially into the substrate sensor. This, however, despite much research, still causes severe charge collection problems. The problem is that some X-rays, for example 8 keV Cu X-rays, need at least 300 μm of Si for optimum sensitivity, and X-rays in the range 11-20 keV would require even much higher thicknesses.

By using germanium in the sensor a much thinner substrate can be used which greatly eases manufacture since through holes can be formed much more easily through thinner substrates, up to 200 μm.

Another important problem with the prior approach such as taught in U.S. Pat. No. 5,889,313 and U.S. Pat. No. 6,204,087 is the dead area introduced by the electrode rods. The diameter of the rods constitute an area which is insensitive to radiation, which is undesirable. It turns out that in the best practical realizations in research not the complete but still a significant part of the diameter is insensitive. Assuming in such devices a typical aspect ratio of the rods of 20:1, the diameter of the rods is 10 microns with a length of 200 microns.

By adopting Ge a lower sensor thickness can be used. In many cases a much thinner sensor can thus be used, in the case of X-rays of 11-15 keV, as used for protein crystallography at synchrotron rings, with a 50 micron Ge sensor an absorption of 95 up to more than 99.5% can be achieved instead of the usual 300 micron Si with 34%-79%, respectively.

It has been realised by the inventor that by virtue of the reduced thickness of the sensor compared with a Si sensor, say by a factor 4, for a constant rod aspect ratio the real and effective rod diameter may be lowered by a factor of up to 4, and thus the insensitive area by a factor of 16, while increasing the absorption significantly.

A further benefit of adopting Ge is that DRIE (deep reactive ion etching) methods, which can be applied in a similar way also to Ge, through the full substrate thickness. It is thereby known that generally hole fabrication can achieve a higher sensor thickness, by means of the much more effort involving laser drilling technique.

Thus, the inventors have realised that many difficulties with the approach of U.S. Pat. No. 5,889,313 and U.S. Pat. No. 6,204,087 can be addressed using a sensor with Ge.

Although the above discussion focuses on X-rays, a further benefit of using Ge based sensors for an electron detection application is that silicon sensors are only radiation hard for electrons up to approximately 200 keV, whereas in many applications 300 keV electrons are used. Ge can absorb even 300 keV electrons even in suitably thin sensors.

In summary therefore, the use of Ge is a significant advance for all these reasons.

BRIEF DESCRIPTION OF THE DRAWINGS

For a better understanding of the invention embodiments will now be described, purely by way of example, with reference to the accompanying drawings, in which.

The figures are schematic and not to scale. In particular, the thickness of thin layers is exaggerated for clarity. Like or similar components are given the same reference numerals in different figures.

DETAILED DESCRIPTION

Figure 1:
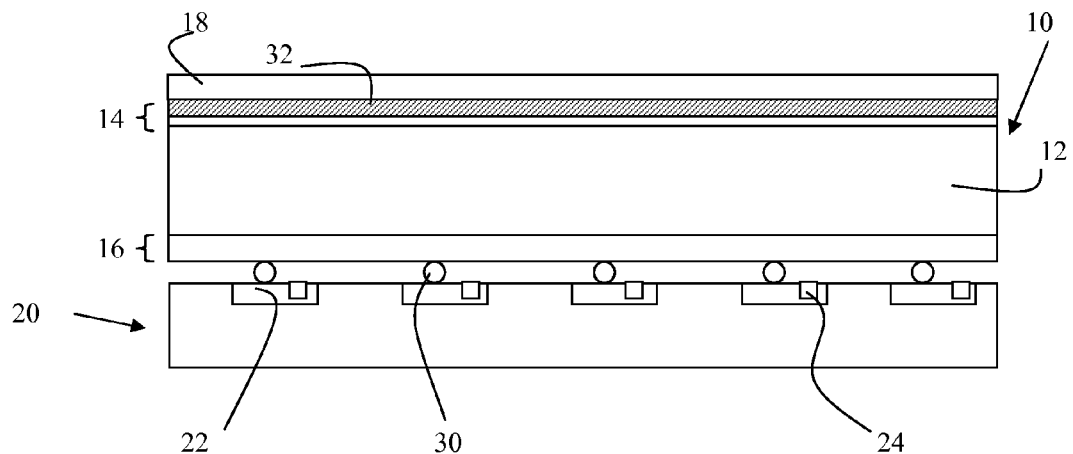
FIG. 1 shows in side view an embodiment of the invention.

Referring to FIG. 1, a sensor 10 is mounted on a read-out chip 20 using a plurality of contact electrodes in the form, in this embodiment, of bump bonds 30. The sensor is unpatterned but may be considered to be divided into separate pixels by the contact electrodes as explained in more detail below. The bump bonds are formed in a two-dimensional array on the sensor, the two-dimensional array defining the pixel locations as the location of each contact electrode represents the centre of a respective pixel.

The read-out chip includes a separate photon counting circuit 22 for each pixel and hence each bump bond 30. The bump bonds 30 constitute contact electrodes.

In the following the case for a planar hybrid pixel detector consisting of an unpatterned sensor is described for convenience. The sensor 10 consists of a germanium substrate 12 having opposed first and second major surfaces. A upper silicon layer 14 is formed to a thickness of 1 to 5 μm on the first (upper) surface, and a lower silicon layer 16 is formed to a thickness of 1 to 5 μm on the second (lower) surface.

In this embodiment the sensor may have a total thickness of 50 μm to 5 mm, or 50 μm to 2 mm, depending on cooling, or even 50 μm to 300 μm. Thick substrates (of order mm) are useful for medical applications. A silicon substrate would need to be many cm thick to have similar absorption.

In view of the thinness of the silicon layers it is possible to use an epitaxial process to grow good single crystal Si on the top and bottom of the germanium substrate 12 to form the upper and lower silicon layers 14,16. Known methods for such a growth process are MBE (molecular beam epitaxy) and CVD (chemical vapour deposition) which may be used.

In order to bias the sensor it is necessary to apply a voltage across the sensor and to this end it is necessary to have contacts to upper and lower surfaces. The lower contacts need to be to bump bonds 30 or other means to directly contact the read-out chip 20.

Accordingly, a upper doping structure 32 is formed at the upper surface of the upper silicon layer 14. The doping structure may be a conventional structure as used in existing Si designs. It is not necessary or even desirable to dope the whole thickness of the upper silicon layer 14, since by keeping the doping away from the Si/Ge interface it is possible to avoid interactions of that interface with the doping structure 32 and hence avoid the need to change conventional doping structures designed for silicon.

The doping structure 32 in particular provides heavy doping adjacent to the surface for making a good ohmic contact to an electrode. The doping structure 32 is typically an implantation to raise the doping in the outer parts of the upper silicon layer to be sufficiently highly doped to form a good contact. Ohmic contacts to silicon are known and so will not be described further.

A upper electrode layer 18 of metallisation is formed on the upper silicon layer 14 making an ohmic contact to the upper doping structure 32.

Note that in this embodiment all of the layers, including the doping structure 32, as well as the Ge layer 12 and Si layers 14, 16 are completely unpatterned. The layers simply extend the full width of the sensor 10. This enormously eases manufacture and ensures that the chip can truly be treated as a silicon wafer for subsequent processing. In particular, any complicated patterning of the Si layers is completely avoided.

As for the read-out chip, each photon counting detector 22 has a threshold and counts pulses having a voltage exceeding the threshold. The photon counting detector 22 includes a bias circuit 24 that, when operating in electron collection mode, applies a positive bias to the bumps 30 with respect to the ohmic electrode 32 and hence applies a positive bias to the rear of the sensor 10 that causes the electrons excited by a radiation photon or electron to drift towards the rear.

The operation of the detector in a predetermined energy range will now be described. For convenience of description, the following description describes the response to X-rays but the same detector will also detect electrons in the same way.

When an incident X-ray photon is absorbed in the sensor 10 it generates a cloud of electrons, and holes. The number of electrons in the cloud is proportional to the energy of the incident X-ray photon. For example, a single photon may create a cloud of 2800 electrons as for an X-ray photon of 8 keV, the energy of Cu radiation typically used in X-ray diffraction experiments When an incident X-ray photon is absorbed in the sensor 10 it will almost certainly be absorbed in the Ge 12 which is both much thicker than the Si layers 14, 16 and has a higher absorption per unit length. Indeed, advantageously at least 90%, preferably 95% or even 97%, of the total absorption of X-rays in the predetermined energy range of interest will be in the Ge substrate 12.

The thickness of the cap layers of Si may be in the order of 1-5 μm and preferably only 1 μm for certain X-rays. The absorption of the top layer is about 1-6% for Cu and Mo X-rays, 8 and 17.4 keV, respectively. In the case of GaAs layers as proposed by U.S. Pat. No. 6,933,503 the GaAs top layer absorbs about 3 times more, which is not preferable. By using the proposed thickness of Si measurement complications caused by differing absorption properties in Ge and Si can be largely avoided.

A bias is applied between the upper electrode 18 and the bump bonds by bias circuit 24. The applied bias causes the electrons to drift towards the positive potential applied at the read-out chip 20 and thus at pads 24 and in particular most of the cloud of electrodes will be drawn towards the nearest bump bond 30. In this way, the location of the bump bonds 30 effectively divides up the sensor into pixels even though the germanium and silicon layers 12,14,16 are entirely unpatterned, each notional pixel area of the sensor 10 being the area closer to each respective bump 30 than to other bumps 30. The electrons are drawn through the respective bump 30 to the respective read-out circuit. The charge is amplified to create an electrical pulse corresponding to the amount of charge and hence the number of electrons generated.

The read-out chip can include circuitry to avoid double counting caused by some electrons of a cloud excited by a single photon or electron passing through adjacent bumps. When a pulse is detected at the same time in adjacent pixels, it is ascribed to only one pixel, for example the pixel which detects the highest charge.

In this embodiment, the pixels are determined by the positions of the bumps. Each cloud of electrons will tend to be collected at the nearest bump so the pixel locations are effectively determined by the bumps.

Figure 2:
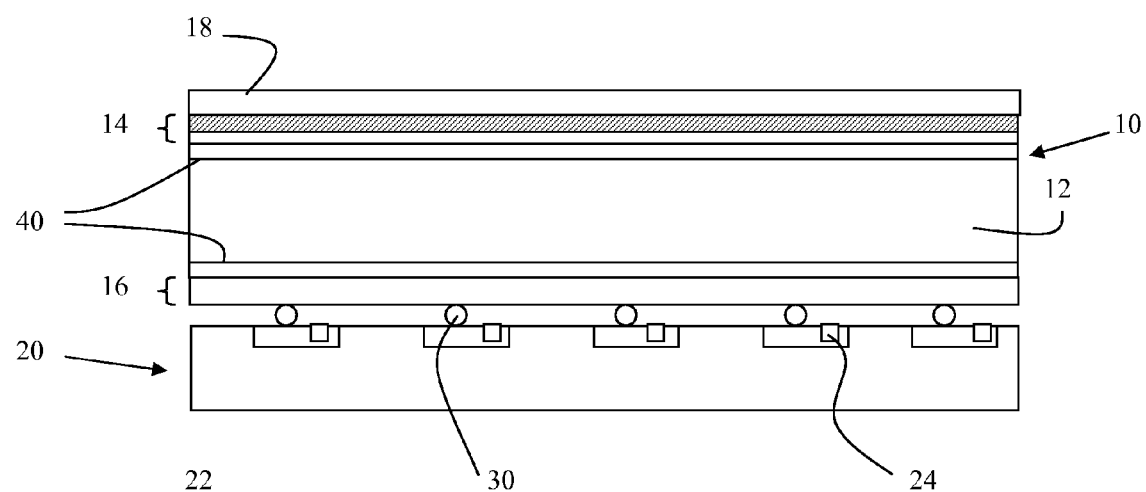
FIG. 2 shows in side view a further embodiment of the invention.

FIG. 2 shows an alternative embodiment with additional buffer layers 40 between the Si capping layers 14, 16 and the Ge layer 12. The buffer layers are graded layers of Si and Ge, the Germanium content being higher adjacent to the Ge substrate 12 and lower adjacent to the Si. The sensor thickness may be substantially the same as in the FIG. 1 embodiment.

The cloud of electrons forming the electron pulse read by the read-out chip should be collected as efficiently as possible and with minimum loss of charge. In this regard, the multiple layers must be arranged to avoid the Si—Ge interfaces between layers resulting in loss of charge. The buffer layers 40 in the embodiment adapts for the lattice mismatch between Ge and Si and has the effect of avoiding interfaces with a high defect level and thereby ensuring that any potential barrier is smooth, improving the collection of charge in the read-out chip.

Figure 3:
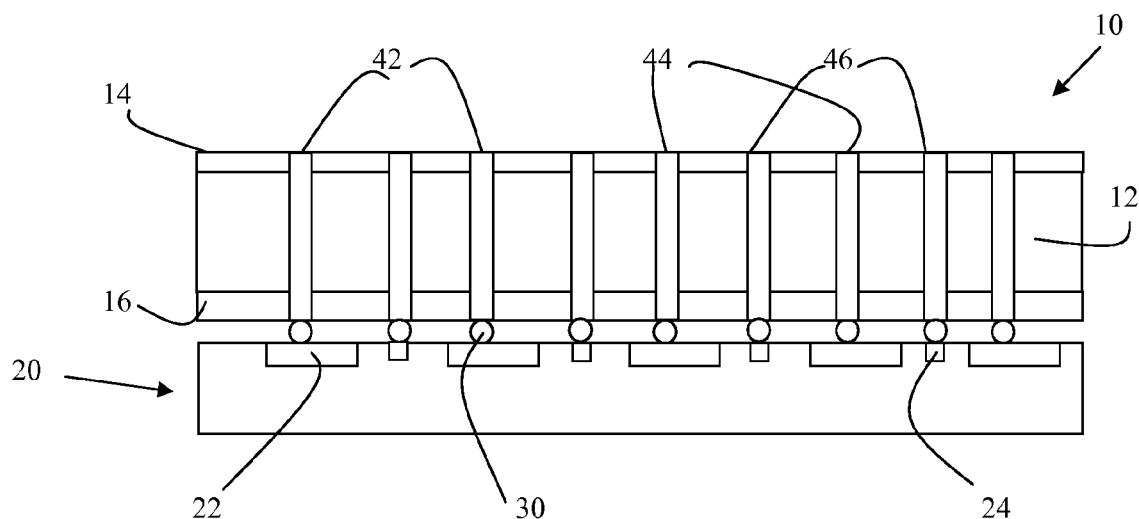
FIG. 3 shows in side view a further embodiment of the invention.

FIG. 3 shows a yet further approach to dealing with the possible impact of the interface potential on electron collection. In particular, rods 42 are provided extending through both the full thickness of the sensor 10, the anode rods accordingly extending substantially perpendicular to the plane of the sensor 10. Each rod 42 is connected to a respective photon counting circuit 22.

Such rods 42 can be made by machining through holes through the sensor 10 and filling the through holes with a suitable conductor. The rods 42 are, in the embodiment, directly connected to the bumps 30.

The rods 42 are divided into anode rods 44 and cathode rods 46, alternating across the sensor.

In a preferred arrangement the anode rods are of n-doped silicon and the cathode rods of p-doped silicon.

Note that unlike the arrangement of FIG. 1, both anode rods 44 and cathode rods 46 are connected to the read-out chip 20 by bump bonds 30 on the lower silicon layer 16.

In use, a bias is applied between the anode rods 44 and cathode rods 46 to provide a lateral electric field. The anode rods are connected to the photon counting detector 22, and electrons excited by ionizing radiation are drawn to the closest anode rod 44 by the lateral electric field, from where they pass to the respective photon counting detector 22.

Apart from the rods 42, the semiconductor layers themselves are unpatterned and there is still a layer of silicon 14, 16 covering both the upper and lower surfaces, essentially not doped but being passivated, allowing the sensor 10 to be processed as silicon. Passivation is a difficult issue for Ge since it lacks suitable oxides as in Si.

In this approach, an electron cloud excited by the X-rays in the Ge substrate 12 can reach a respective anode rod 44 without crossing the Si—Ge interface between the substrate 12 and capping layers 14, 16.

Note that the approach according to this arrangement solves a problem that exists with current X-ray detectors under research using anode rods such as that described in U.S. Pat. No. 5,889,313 and U.S. Pat. No. 6,933,503. Implementations of these detectors use a 200 μm Si substrate in view of difficulties in forming suitable holes through thicker substrates without the pixel size becoming too large and the rods too broad.

Alternatively, a 300 μm Si sensor is used with a rod structure whereby the rods do only extend partially, to about 200

μm from the bottom or the top side into the sensor. This, however, despite much research, still causes severe charge collection problems. The problem is that some X-rays, for example 8 keV Cu X-rays, need at least 300 μm of Si for optimum sensitivity, and X-rays in the range 11-20 keV would require even much higher thicknesses.

Another important problem with the 3D sensor approach is the dead area introduced by the electrode rods. The diameter of the rods constitute an unwanted insensitive area to radiation. It turned out that in the best practical realizations in research not the complete but still a significant part of the diameter is insensitive. For example, if the achievable aspect ratio is 20:1 the diameter of the rods is 10 microns with a length of 200 microns. Aspect ratios of 15:1 or 20:1 may be achievable.

With the introduction of the invention a lower sensor thickness can be adopted. In many cases a much thinner sensor can thus be used. In the case of X-rays of 11-15 keV, as used for protein crystallography at synchrotron rings, with a 50 micron Ge sensor an absorption of 95% up to more than 99.5% can be achieved instead of the usual 300 micron Si with 34%-79%, respectively. The lower sensor thickness, for example a factor 4, leads to a reduction in both the real rod diameter and the effective rod diameter by up to a factor of 4, and thus a reduction the insensitive area by a factor of 16, while increasing the absorption significantly. As a result, this technology may give particular benefits for this important application.

By using the Ge wafer approach, the substrate can be thinner using the invention than by simply using the Si substrate of U.S. Pat. No. 5,889,313 and U.S. Pat. No. 6,204,087. This allows holes to be machined by MEMS techniques including DRIE etching methods, which can be applied in a similar way also to Ge, through the full substrate thickness. It is thereby known that generally hole fabrication can achieve a higher sensor thickness, by means of the much more effort involving laser drilling technique.

Thus, the sensor thickness in this embodiment may be 50 μm to 200 μm, or even 50 μm to 100 μm.

It will be appreciated by those skilled in the art that the above description is purely by way of example and many variations are possible.

Although the flip chip bumps 30 are shown as round bumps in the drawings in practice the bumps 30 may of course be flat layers deposited by evaporation, or indeed layers for making a direct bond between the sensor 10 and read-out chip 20.

Also, although the above description describes a thresholding read-out chip that effectively acts as a photon counter, the sensor 10 may also be used with an energy-dispersive read-out chip that measures the size of each pulse detected to give a measure of the energy of the radiation received.

Further, the use of relative terms such as "upper", "lower" and "top" are not intended to imply any particular orientation of the sensors in space.

What is claimed is:

1. An imaging detector for detecting ionizing radiation such as X-rays or electron radiation, in a predetermined energy range, comprising:
    a sensor having a germanium substrate having opposed first and second major surfaces, a upper silicon layer on the first major surface and a lower silicon layer on the second major surface, wherein the germanium substrate, upper silicon layer, and lower silicon layer are unpatterned, the sensor having a doped upper ohmic contact region formed in the upper silicon layer and a conductive electrode on the doped upper ohmic contact region in contact with the doped upper ohmic contact region;
    a plurality of contact electrodes connected to the lower silicon layer, the plurality of electrical contacts being arranged in a two-dimensional array to define a respective plurality of pixels; and
    a read-out chip connected to the sensor by the contact electrodes.

2. An imaging detector according to claim 1 wherein the electrical contacts are bump bonds.

3. An imaging detector according to claim 1 including graded silicon germanium buffer layers between the germanium substrate and each of the upper and lower silicon layers.

4. An imaging detector according to claim 1 wherein the thickness of the sensor is in the range 50 μm to 50 mm.

5. A sensor according to claim 1 wherein the upper and lower silicon layers each have a thickness in the range from 1 μm to 5 μm.

* * * * *

UNITED STATES PATENT AND TRADEMARK OFFICE
CERTIFICATE OF CORRECTION

PATENT NO.         : 7,538,328 B1  
APPLICATION NO. : 12/041148  
DATED                : May 26, 2009  
INVENTOR(S)       : Klaus Bethke Page 1 of 1

It is certified that error appears in the above-identified patent and that said Letters Patent is hereby corrected as shown below:

In Col. 8, line 38  
replace "50 mm"  
with "5 mm"

Signed and Sealed this

Twenty-seventh Day of October, 2009

David J. Kappos  
*Director of the United States Patent and Trademark Office*